(12) United States Patent
Covino et al.

(10) Patent No.: US 6,854,041 B2
(45) Date of Patent: Feb. 8, 2005

(54) DRAM-BASED SEPARATE I/O MEMORY SOLUTION FOR COMMUNICATION APPLICATIONS

(75) Inventors: James J. Covino, Middlesex, VT (US); Kevin G. Petrunich, Williston, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 10/065,839

(22) Filed: Nov. 25, 2002

(65) Prior Publication Data

US 2004/0100851 A1 May 27, 2004

(51) Int. Cl.$^7$ .............................................. G06F 13/14
(52) U.S. Cl. ...................................................... 711/167
(58) Field of Search ................................ 711/104, 105, 711/167, 106, 169

(56) References Cited

U.S. PATENT DOCUMENTS 6,256,716 B1 * 7/2001 Pham ........................ 711/167
6,401,167 B1 * 6/2002 Barth et al. ................. 711/106
6,728,161 B1 * 4/2004 Roohparvar ................ 365/233

* cited by examiner

Primary Examiner—Kevin L. Ellis
(74) Attorney, Agent, or Firm—McGinn & Gibb, PLLC; Robert A. Walsh, Esq.

(57) ABSTRACT

A structure and method for performing back-to-back read and write memory operations to a same DRAM bank comprising articulating between reading data on a first bank during successive first bank read cycles and writing data to a second bank during successive second bank write cycles, cycling between reading data on the second bank during successive second bank read cycles and writing data to the first bank during successive first bank write cycles, and performing a refresh cycle on the first and second bank, wherein the first bank write cycles lag the first bank read cycles, and wherein the second bank write cycles lag the second bank read cycles. Moreover, the read and write memory operations constantly swap between the read and write cycles and between the first and second bank.

35 Claims, 9 Drawing Sheets

FOUR READ/WRITE OPERATIONS WITHIN THE SAME BANK ARE SHOWN, BUT CAN BE TWO, FOUR, SIX, EIGHT, ...

DRAM-BASED SEPARATE I/O MEMORY SOLUTION FOR COMMUNICATION APPLICATIONS

BACKGROUND OF THE INVENTION

1. Field of the Invention

The present invention generally relates to integrated circuits and, more particularly to input/output (I/O) architecture, and read/write systems for high bandwidth semiconductor memories.

2. Description of the Related Art

Increasing the speed of operation and bandwidth continue to be one of the incentives behind evolutionary changes in the design, development, and implementation of memory circuits. For example, for dynamic random access memories (DRAMs), the extended data output (EDO) architecture was developed to enhance memory bandwidth. With synchronous DRAMs (SDRAMs), the ability to channel the data as well as data pre-fetch schemes have helped increase the speed, throughput, and bandwidth of the memory. For example, the quad data rate (QDR) SRAM uses a four-bit pre-fetch technique to quadruple the bandwidth of the memory circuit. However, this increase in bandwidth is often accompanied by a significant increase in the overall size and cost of the memory device.

As mentioned, one of the drawbacks of conventional QDR SRAMs is the corresponding increase in the overall size, and specifically, the number of I/O interconnect lines required to process the quad bits during read and write operations. For example, in a QDR SRAM having a by N organization (or xN, such as x16 or x32), a 4-bit pre-fetch results in 4N bits of data being output from the memory array in read mode. Usually, the total columns in an array are divided into two sets of even and odd columns, each delivering N bits of data. The 2N columns connect to corresponding 2N sense amplifiers, with the 2N sense amplifiers driving 2N global I/O lines. Thus, a 2:1 parallel to serial conversion at the output takes place prior to the data being applied to the N data output (DQ) registers. This process is reversed for the write mode of operation, wherein a serial-to-parallel conversion turns a serial bit into quad bits for QDR.

The ability to achieve the cycle time associated with SRAM technology by using a DRAM has not yet been achieved. Those skilled in the art acknowledge that one can achieve a 4x density improvement (bit density) using DRAM over SRAM. For example, a 16 Mb SRAM approximates to a 128 Mb DRAM. However, a DRAM is much slower than its SRAM counterpart. Thus, it would be very beneficial to utilize DRAM technology due to its increased memory capacity, but to increase the DRAM speed in order to compete with SRAM processing speed. Thus, the ability to achieve the cycle time associated with SRAM technology by using a DRAM is desirable.

Separate I/O QDR SRAMs are the preferred solution in the networking/communications SRAM-memory space. Separate I/O allows read and write buses to be loaded simultaneously as memory operations constantly swap between read and write cycles. FIG. 1 shows a conventional SRAM QDR timing diagram with an 8 ns cycle, and a burst of 4. Moreover, conventional DRAM banking solutions use any number of banks to improve cycle time and data rate by:

DRAM Cycle
# of Banks

For example, a 16 ns DRAM with two banks can provide an 8 ns cycle part. FIG. 2 illustrates a conventional two-bank DRAM QDR timing diagram with an 8 ns cycle, and a burst of 4. As shown, banking protocols exist which partition the memory array into several different arrays, which can then be independently addressable. That is, the partition of the memory array occurs in the bank. Conventionally, as illustrated in FIG. 1, in an 8 ns timing protocol, a first bank (Bank 1) is accessed. After an 8 ns cycle lapses, only then can the same bank (Bank 1) be accessed.

Thus, in a single bank solution as illustrated in FIGS. 1–2, the same bank may be accessed only every 8 ns (the length of the entire cycle time), and during the cycle, only other banks may be accessed, not the same bank. By utilizing a multi-bank approach, for example, four banks, bandwidth maximization is achieved; as such data throughput is maximized. However, the disadvantage of such multi-banking approaches is it breaks away from the desired randomness, which is sought in banking address operations. Therefore, there is a need to access the same bank back-to-back using a multi-bank approach.

The advantage of DRAM as a replacement of SRAM memory space is becoming very popular as merged logic/DRAM processes and novel circuit techniques have enabled DRAM cycle times to shrink considerably. The need for separate I/O SRAMs with a QDR protocol has emerged as one of the standards for communication applications. Thus, there remains a need for a DRAM-based solution for the Quad Data Rate timing protocol, which allows access to the same bank during back-to-back operations.

SUMMARY OF THE INVENTION

The invention provides a DRAM-based separate I/O memory solution for communication applications. The present invention provides a DRAM-based solution to the standard QDR communications-SRAM solution. The present invention provides data rate and cycle times comparable to conventional QDR SRAMs. The present invention achieves at least four times the density and price/bit of conventional QDR SRAM implementations. The present invention provides a novel banking system allowing back-to-back operations to be performed on a given bank.

There is provided, according to one aspect of the invention a method of performing back-to back read and write memory operations to the same DRAM bank, wherein the method comprises articulating between reading data on a first bank during successive first bank read cycles and writing data to a second bank during successive second bank write cycles, cycling between reading data on the second bank during successive second bank read cycles and writing data to the first bank during successive first bank write cycles, and performing a refresh cycle on the first and second bank, wherein the first bank write cycles lag the first bank read cycles, and wherein the second bank write cycles lag the second bank read cycles.

The step of articulating comprises reading data on the first bank during the first bank read cycle, writing data to the second bank during the second bank write cycle, reading additional data on the first bank during the first bank read cycle, and writing additional data to the second bank during the second bank write cycle. The step of cycling comprises reading data on the second bank during the second bank read cycle, writing data to the first bank during the first bank write cycle, reading additional data on the second bank during the second bank read cycle, and writing additional data to the first bank during the first bank write cycle.

A refresh cycle is performed on the first bank after the step of writing additional data to the second bank. Additionally, a refresh cycle is performed on the second bank after the step of writing additional data to the first bank. The read/write memory operations constantly swap between the read and write cycles. Moreover, the read/write memory operations constantly swap between the first and second bank. Also, the read/write memory operations occur in a frequency of 2n times within the same bank. Furthermore, the lag comprises at least two write cycles.

The present invention also provides a method of performing back-to-back read/write memory operations to a same DRAM bank, wherein the method comprises reading data on a first bank during an nth read cycle, writing data to a second bank during a nth write cycle, reading data on the first bank during a (nth+1) read cycle, writing data to the second bank during a (nth+1) write cycle, refreshing data on the first bank, reading data on the second bank during a (nth+2) read cycle, writing data to the first bank during a (nth+2) write cycle, reading data on the second bank during a (nth+3) read cycle, writing data to the first bank during a (nth+3) write cycle, and refreshing data on the second bank, wherein the read/write memory operations occur in a frequency of 2n times within the same bank.

Additionally, according to the present invention, a method of accessing banks of dynamic random access memory (DRAM) memory is provided, wherein the method comprises applying a first group of access requests to a first DRAM memory bank during a first time period, wherein at least one of the access requests is buffered; and applying a second group of access requests to a second DRAM memory bank during a second time period, wherein access requests that are buffered during the first time period are executed during the second time period. The first and second group of access requests comprise read/write memory operations constantly swapping between read and write cycles, wherein the read/write memory operations occur in a frequency of 2n times within each of the first DRAM memory bank and the second DRAM memory bank, respectively.

The present invention further comprises a multi-bank memory circuit operable to allow back-to-back read/write memory operations to be performed on a same DRAM bank, wherein the circuit comprises a plurality of independently addressable DRAM memory banks, a refresh counter connected to the DRAM memory banks, a read register connected to the DRAM memory banks, a write register connected to the DRAM memory banks, and an address comparator connected to the read and write registers, wherein the refresh counter is operable to send an address to each DRAM memory bank, wherein the read register is operable to send a read address to each DRAM memory bank, wherein the write register is operable to send a write address to each DRAM memory bank, and wherein the address comparator is operable to compare the read and write addresses.

The circuit further comprises a partition array located in each DRAM memory bank, and an input clock operatively connected to the read and write registers, wherein the input clock is operable to capture the data from the read and write registers. Moreover, the address comparator monitors the write registers to determine if the write address has been stored in the partition array. Also, the refresh counter is operable to track all addresses to be refreshed. Moreover, the read/write memory operations constantly swap between a read and write cycle. The plurality of DRAM memory banks comprises a first and second DRAM memory bank, wherein the read/write memory operations constantly swap between the first and second DRAM memory banks. Furthermore, the read/write memory operations occur in a frequency of 2n times within the same bank.

There are several benefits of the present invention. For example, the present invention provides a novel DRAM-based separate I/O memory solution for communication applications. Also, the present invention provides a novel DRAM-based solution to the standard QDR communications-SRAM solution. Additionally, the present invention provides data rate and cycle times comparable to conventional QDR SRAMs. Furthermore, the present invention achieves at least four times the density and price/bit of conventional QDR SRAM implementations. Another benefit of the present invention is that it provides a novel banking system whereby back-to-back operations are performed on a given bank.

BRIEF DESCRIPTION OF THE DRAWINGS

The invention will be better understood from the following detailed description of a preferred embodiment(s) of the invention with reference to the drawings, in which.

DETAILED DESCRIPTION OF PREFERRED EMBODIMENT OF THE INVENTION

Figure 1:
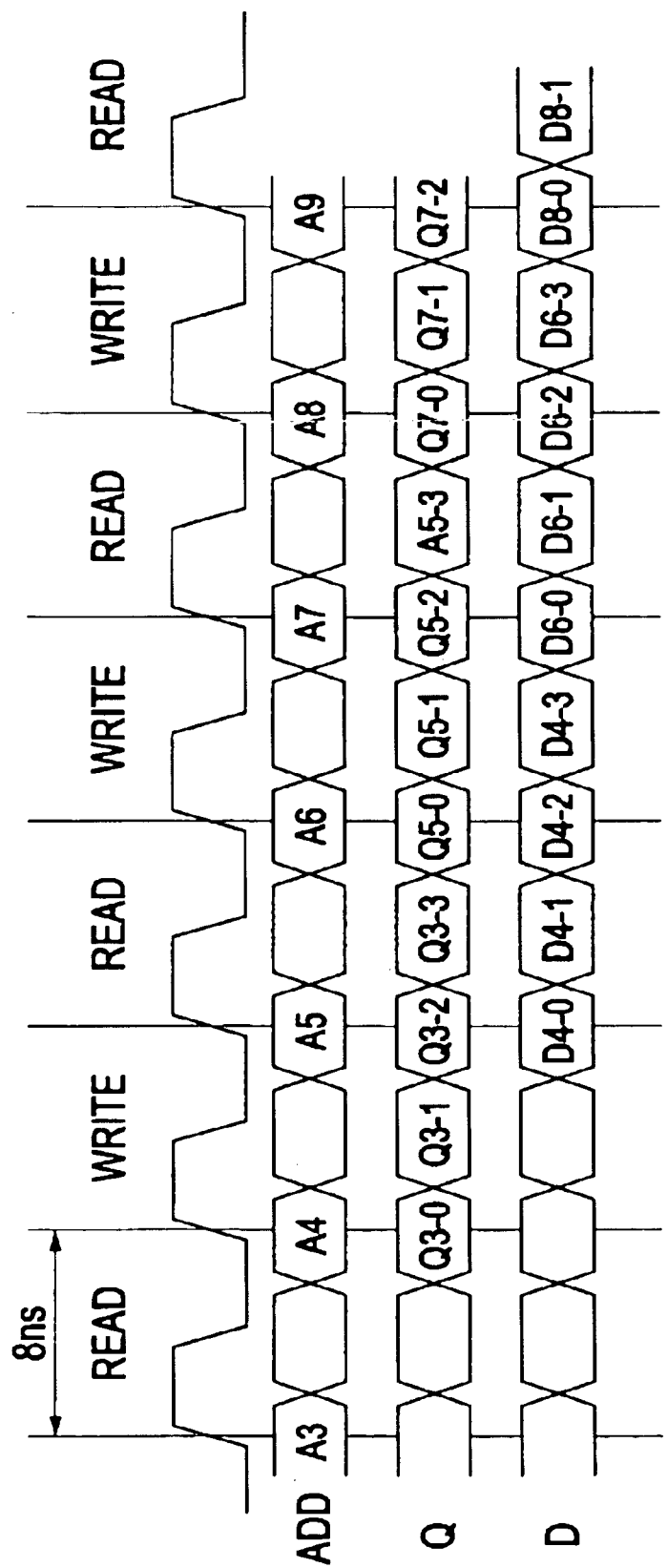
FIG. 1 is a schematic illustration of a conventional QDR SRAM timing diagram.
Figure 2:
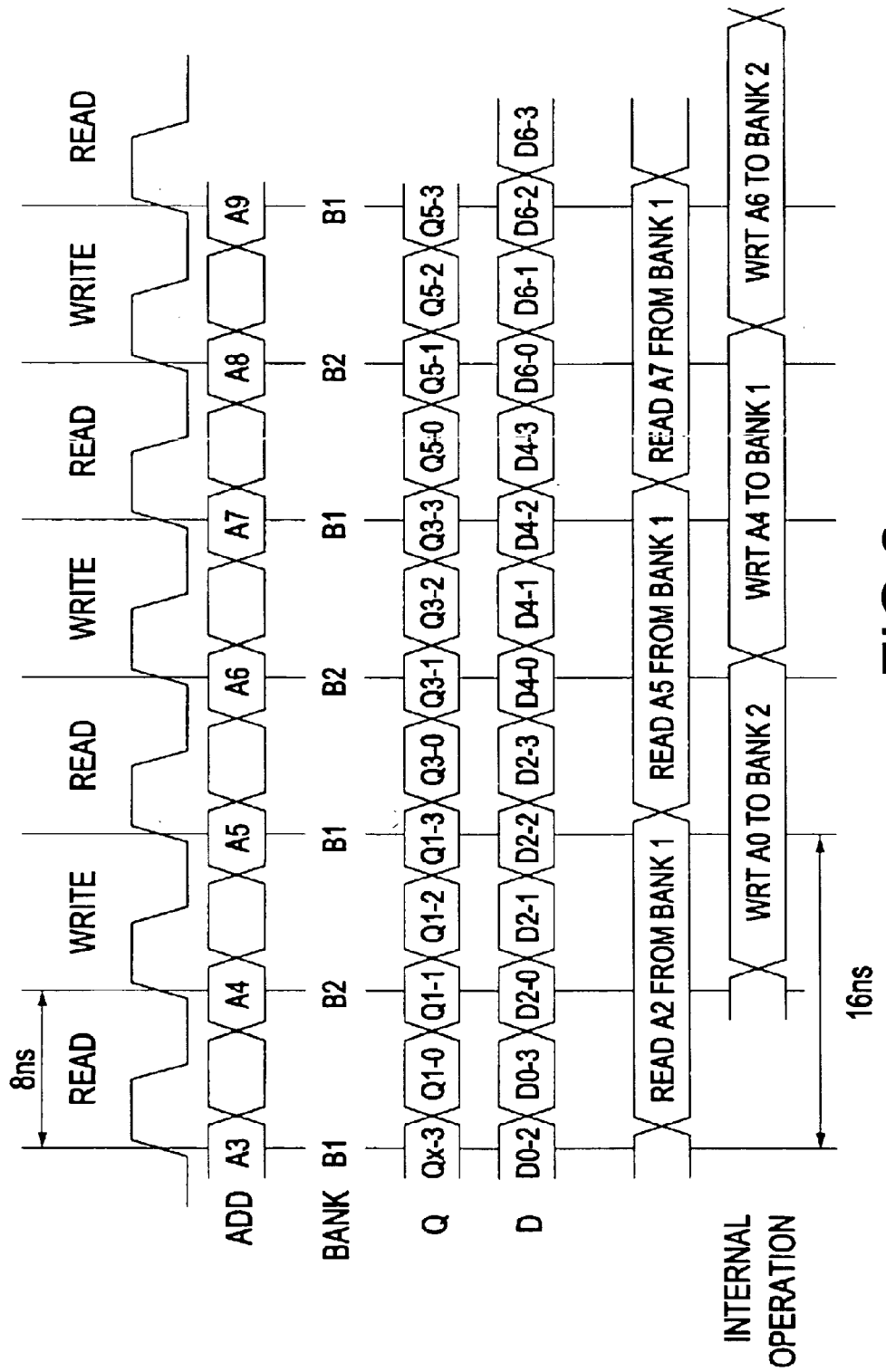
FIG. 2 is a schematic illustration of a conventional two-bank QDR DRAM timing diagram.

As mentioned, there remains a need for a DRAM-based solution for the Quad Data Rate timing protocol. Referring now to the drawings, and more particularly to FIGS. 3 through 11, there are shown preferred embodiments of the methods and structures according to the present invention.

A DRAM solution is most useful as a replacement to QDR-SRAM if back-to-back operations can be performed on the same bank. The present invention solves the problems inherent in the prior art solutions. For example, the multi-bank memory device of the present invention allows back-to-back read-write operations to the same bank.

Typically, data in an array must be periodically refreshed. In a read cycle, the data is destroyed and then written back to the memory. A charge in the cell dissipates over time and therefore the cells must be refreshed in order for the data to be retained. During a refresh operation, every row in a DRAM is methodically reviewed and the data is read and written back into the cell (this occurs every few milliseconds). The present invention simulates a process where it appears that a refresh operation is unnecessary by using buffers to bury the refresh operations between read and write cycles. As such, the present invention provides a background refresh operation to take place between the banks, thereby burying the refresh operations as indicated above. This assures that all of the rows in the memory are adequately refreshed. During this background refresh operation, a counter counts the rows, thereby reading the rows. Thus, not all rows are refreshed during one operation as with conventional devices.

Figure 3:
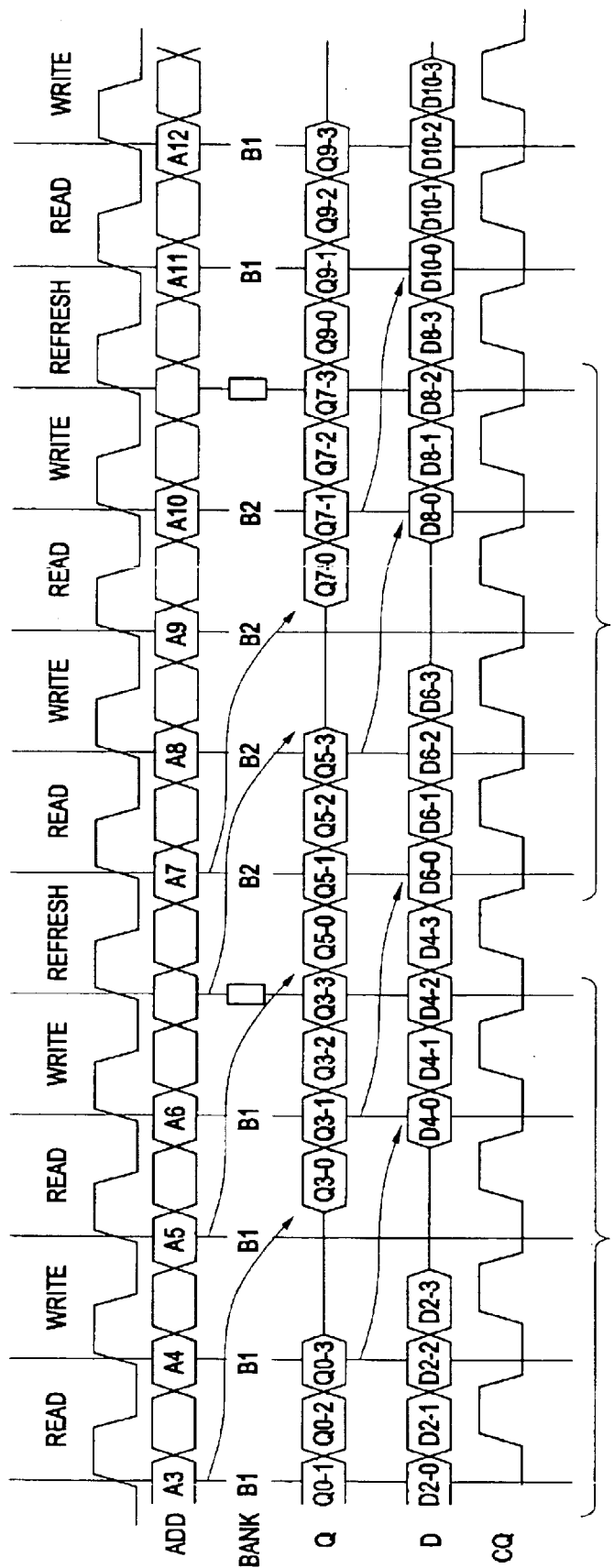
FIG. 3 is a schematic illustration of a QDR timing diagram according to the present invention.

As illustrated in the timing diagram of FIG. 3, where Q is data coming out of the memory, and D is write data written into the memory, during the first read operation, the invention accesses memory locations through location address A3 (the memory data must wait because of the inherent latency of DRAM as mentioned above). Then, during the next read cycle, the data comes out in a burst of 4 through address A5.

Thus, the present invention holds data into output registers, while burst registers hold the data from address A3 to A5. Moreover, the present invention allows the write data to be presented to the memory two cycles after the write command. Essentially, the present invention lags the read and write cycles. As shown in FIG. 3, during the first write cycle, 4 burst bits of data, D2-0, D2-1, D2-2, and D2-3 are held in a buffer. Also, the data coming out of the memory during the first read cycle (at A3), Q0-1, Q0-2, and Q0-3 is read data from the previous read operation.

Figure 4:
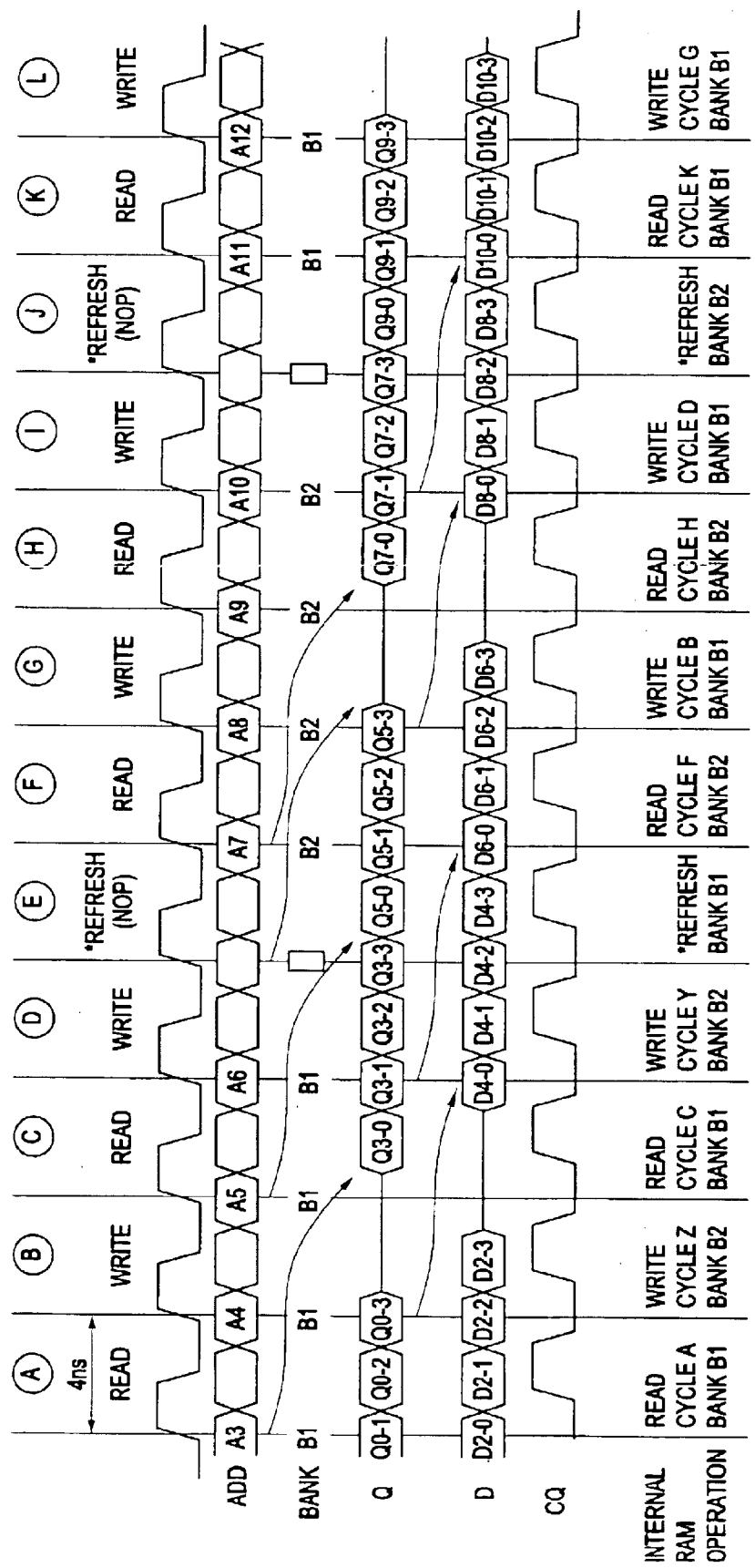
FIG. 4 is a schematic illustration of a QDR timing diagram according to the present invention.

FIG. 4 illustrates a detailed timing protocol diagram in a multi-bank DRAM implementation with back-to-back read/write operations to the same bank. This illustrates what occurs in the memory (internal RAM operation). For example, there are twelve cycles shown (labeled A through L). The read cycles always occur in the same cycle. Specifically, during the memory operation of Cycle A, a read operation (reading data Q3-0, Q3-1, Q3-2, and Q3-3) for that cycle occurs (i.e., read Cycle A) on a first bank (B1). However, the write operation on the first bank (B1) is lagged, and does not occur until after two write cycles occur on the second bank (B2). Thus, the present invention provides a continuous internal bank swap (B1–B2 flip flop). The CQ represents an echo clock, wherein the memory device outputs Q and CQ data signals and is received by a receiving device, such as a processor or cache, which uses the echo clock to capture the data Q. The refresh cycle operations are sandwiched (buried) in between two bank swaps, as further illustrated in FIG. 4. As a result, no refresh-only operations are required.

The DRAM-specific separate I/O timing protocol described above and illustrated in FIGS. 3 and 4 illustrate how the high bandwidth can be obtained with a DRAM-based solution. Although the latency is not as aggressive as what a SRAM counterpart offers, the DRAM approach of the present invention provides as high or higher bandwidth (data rate) with a corresponding density increase and reduction in chip size. The DRAM design of the present invention provides the data width necessary for the high frequency bursting of data.

Figure 5:
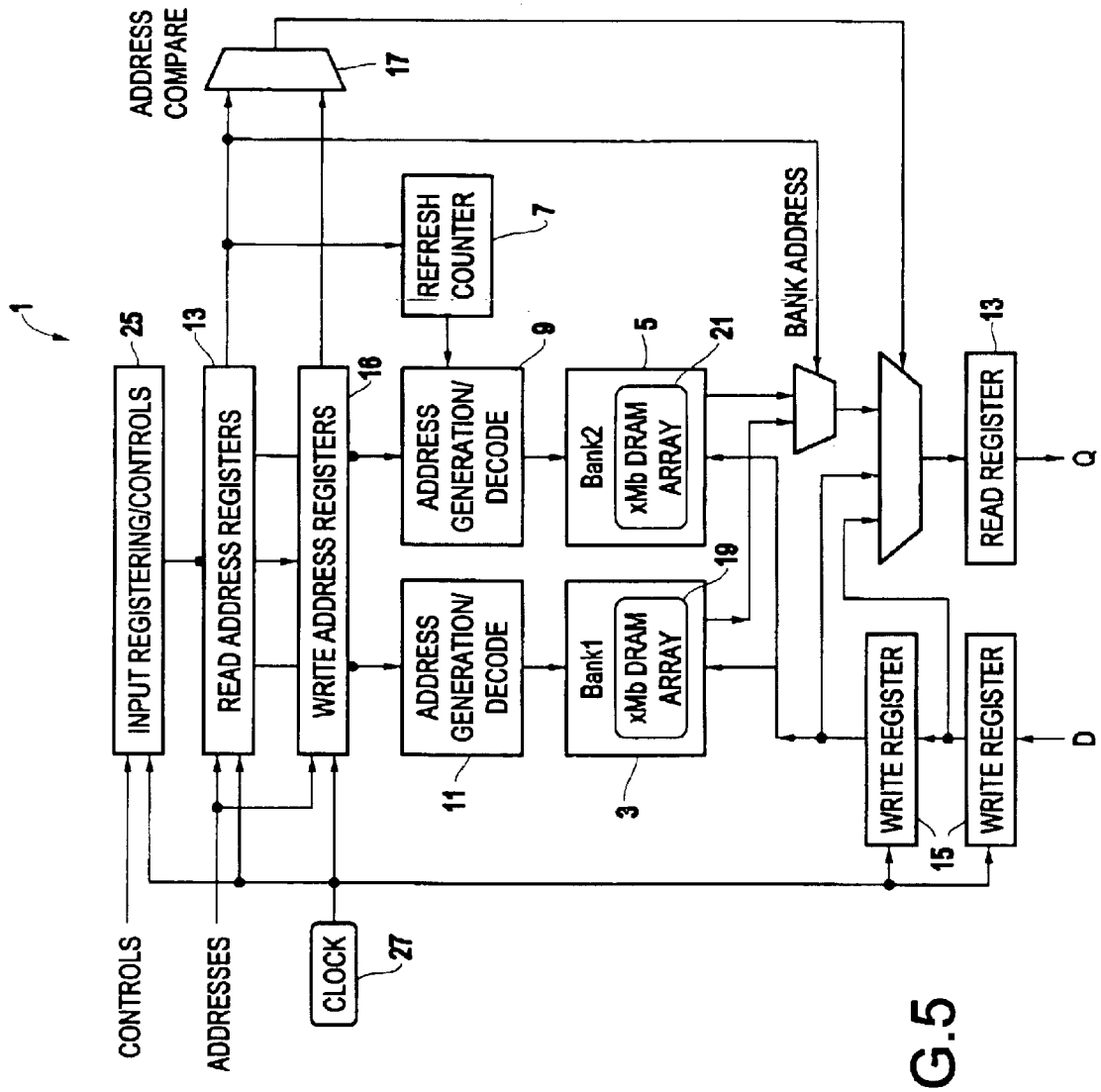
FIG. 5 is a schematic block diagram of a multi-bank memory system according to the present invention.

FIG. 5 illustrates a multi bank memory circuit 1 operable to allow back-to-back read/write memory operations to be performed on a same DRAM bank 3,5, wherein the circuit 1 comprises a plurality of independently addressable DRAM memory banks 3,5; a refresh counter 7 connected to the DRAM memory banks 3,5; a read register 13 connected to the DRAM memory banks 3,5; a write register 15 connected to the DRAM memory banks 3,5; an address comparator 17 connected to the read and write registers 13, 15, respectively; and a plurality of buffers connected to the DRAM memory banks, wherein the buffers artificially reduces an apparent cycle time of the DRAM memory banks, wherein the refresh counter 7 is operable to send an address 9, 11 to each DRAM memory bank 3,5, wherein the read register 13 is operable to send a read address to each DRAM memory bank 3,5, wherein the write address registers 16 are operable to send a write address to each DRAM memory bank 3,5, and wherein the address comparator 17 is operable to compare the read and write addresses.

The circuit 1 further comprises a partition array 19, 21 located in each DRAM memory bank 3,5, respectively, and an input clock 27 operatively connected to the read and write registers 13, 15, wherein the input clock 27 is operable to capture the data D, Q from the read and write registers 13, 15. Moreover, the address comparator 17 monitors the write address registers 16 to determine if the write address has been stored in the partition array 19, 21. Also, the refresh counter 7 is operable to track all addresses to be refreshed. Moreover, the read/write memory operations constantly swap between a read and write cycle. As shown, the plurality of DRAM memory banks comprises a first and second DRAM memory bank 3, 5, respectively, wherein the read/write memory operations constantly swap between the first and second DRAM memory banks 3, 5, respectively. This allows the invention to make it appear as though the cycle time is less than the actual cycle time. Furthermore, the read/write memory operations occur in a frequency of 2n times within the same bank 3, 5, again making it appear as though the cycle time is less than the actual cycle time. Finally, as illustrated in FIG. 5, an input registering/control unit 25 is provided in the circuit 1 which connects to the input clock 27.

The invention achieves a number of advantages by grouping read/write access requests. While one group of access requests is being made to a first bank 3, no access requests are made to an alternate second DRAM memory bank 5. Once the group of access requests is completed on the first bank 3, a second group of access requests is applied to the second alternate DRAM memory bank 5. Thus, during a first time period, a first group of access requests is made to a first DRAM memory bank 3 and no access requests are made to a second DRAM memory bank 5. During the next time period, a second group of access requests are made to the second DRAM memory bank 5 while no access requests are made to the first DRAM memory bank 3.

Thus, each DRAM memory bank 3, 5 has some "idle time" during which no access requests are being directly made. The invention utilizes this "idle time" to reduce the apparent cycle time of each of the banks 3, 5. Thus, the invention accepts more requests than can be processed during each bank's cycle time and buffers half of the requests. Then, during that bank's idle time (when that bank is not receiving direct accessed requests), the buffered requests can be processed. With two banks, the apparent cycle time can be reduced in half. With four banks operating according to this system, the apparent second time can be reduced to ¼ the actual cycle time.

Thus, the invention artificially reduces the apparent cycle time of the different DRAM memory banks 3, 5 through the use of buffers. The invention processes a first request (a read request) and accepts a second request (a write request) before the first bank's cycle time has completed. The invention stores this second request in a buffer and processes it later during its idle time. Then, the invention accepts as a third request (a second read request). At the time of the third request, the bank's cycle time has completed so that it can process the third request. Note that at this time the second request still remains in a buffer. The invention can then take a fourth request (a second write request) before the cycle time has completed, so long as this request is also placed in a buffer.

A feature of the invention is that while the invention is handling requests for the second DRAM memory bank 5, it has time to process the buffered requests on the first bank 3. This allows the invention to make it appear as though the cycle time is less than the actual cycle time. However, in reality, because the operations are performed in groups, half of the operations are buffered. These buffer operations are executed while requests are made to another bank.

Using a numerical example, banks 1 and 2 (3, 5) in FIG. 5 could have a cycle time of 10 nanoseconds. The invention allows back-to-back read and write requests to occur every 5 nanoseconds. For example, if there were four requests in a group, this would take 20 nanoseconds. Given the cycle time of 10 nanoseconds, two requests of the group could be directly processed and two would be buffered. The first and third requests (read requests) made to bank 1 would be executed while the second and third requests (write requests) would be buffered. Then, a second group of requests would be made to bank 2. This second group of requests (e.g., 4 requests) also consumes 20 nanoseconds. This 20 nanoseconds is used by bank 1 to process the two buffered write requests. Similarly, during the processing of the second group of requests, bank 2 would buffer two requests which would be processed during bank 2's idle time (during the next group of access requests made to bank 1).

Figure 6:
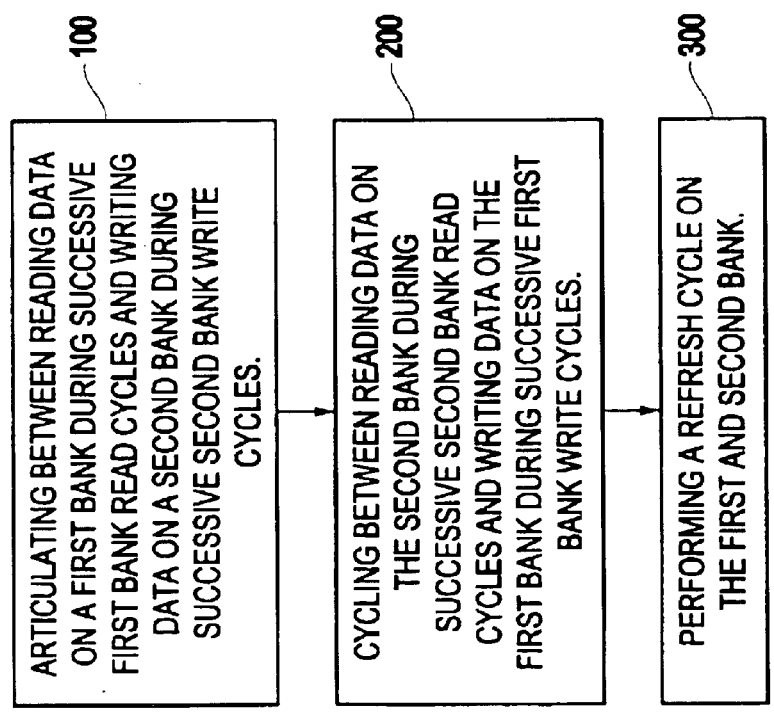
FIG. 6 is a flow diagram illustrating a preferred method of the invention.

A method of performing back-to-back read/write memory operations to a same DRAM bank is illustrated in the flow diagram in FIG. 6, wherein the method comprises articulating 100 between reading data on a first bank 3 during successive first bank read cycles and writing data to a second bank 5 during successive second bank write cycles, cycling 200 between reading data on the second bank 5 during successive second bank read cycles and writing data to the first bank 3 during successive first bank write cycles, and performing 300 a refresh cycle on the first and second bank 3, 5, respectively, wherein the first bank write cycles lag (are delayed) the first bank read cycles, and wherein the second bank write cycles lag (are delayed) the second bank read cycles. The lag or delay period comprises at least two write cycles.

Figure 7:
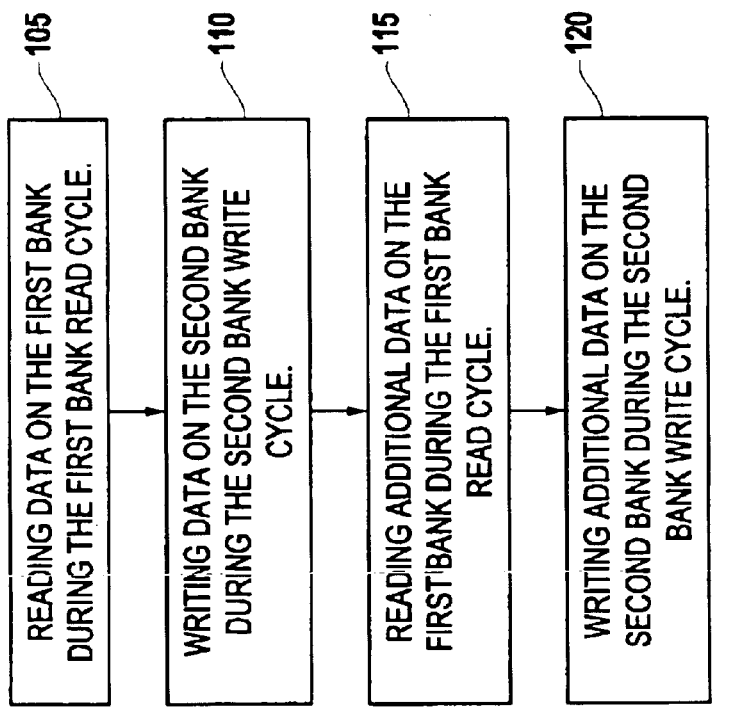
FIG. 7 is a flow diagram illustrating a preferred method of the invention.

As shown in FIG. 7, the step of articulating 100 comprises reading 105 data on the first bank 3 during the first bank read cycle, writing 110 data to the second bank 5 during the second bank write cycle, reading 115 additional data on the first bank 3 during the first bank read cycle, and writing 120 additional data to the second bank during the second bank write cycle.

Figure 8:
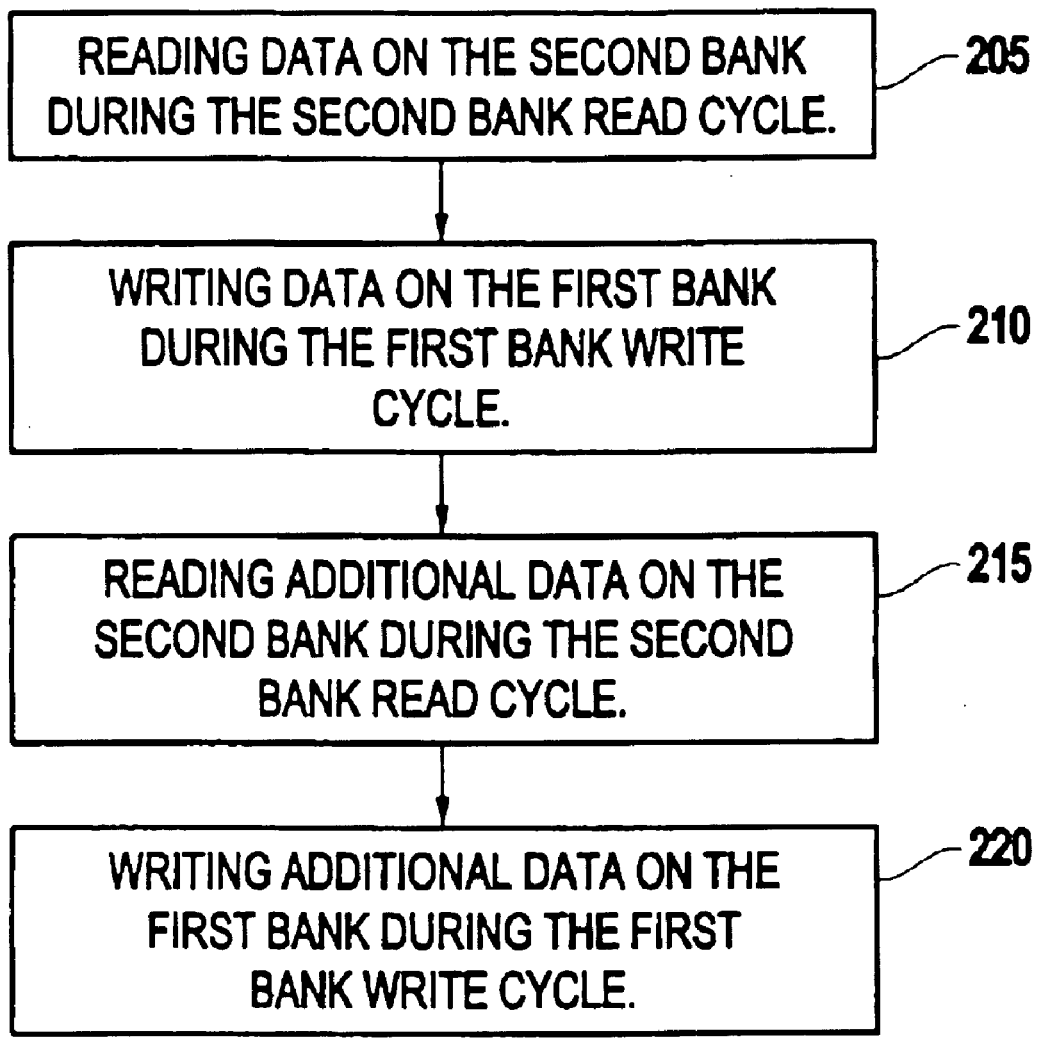
FIG. 8 is a flow diagram illustrating a preferred method of the invention.

Furthermore, as illustrated in FIG. 8, the step of cycling 200 comprises reading 205 data on the second bank 5 during the second bank read cycle, writing 210 data to the first bank 3 during the first bank write cycle, reading 215 additional data on the second bank 5 during the second bank read cycle, and writing 220 additional data to the first bank 3 during the first bank write cycle.

The step 300 of performing a refresh cycle occurs on the first bank 3 after the step 120 of writing additional data to the second bank 5. Additionally, the step 300 of performing a refresh cycle is performed on the second bank 5 after the step 220 of writing additional data to the first bank 3.

Figure 9:
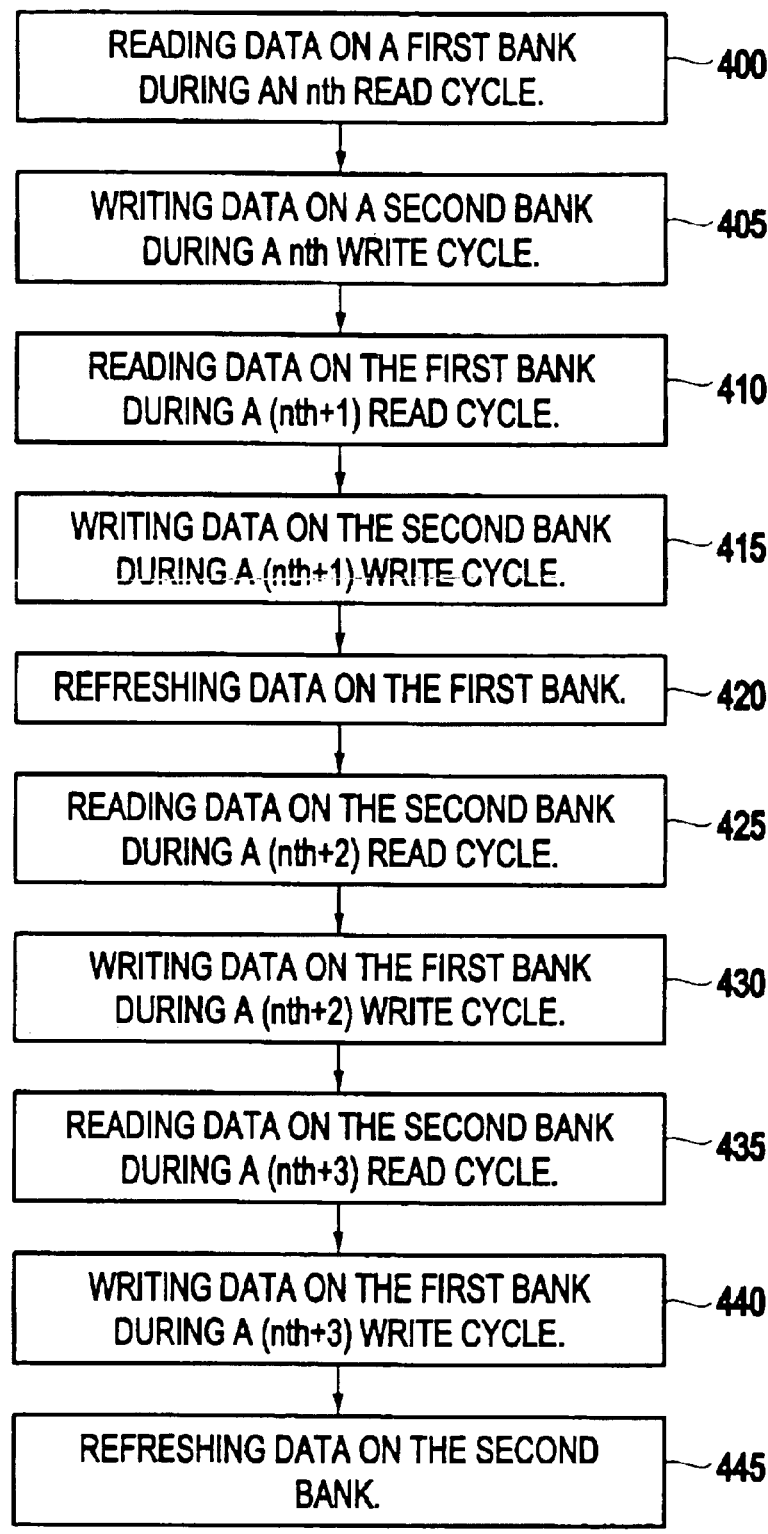
FIG. 9 is a flow diagram illustrating a preferred method of the invention.

Alternatively, as shown in the flow diagram in FIG. 9, the present invention provides a method of performing back-to-back read/write memory operations to a same DRAM bank, wherein the method comprises reading 400 data on a first bank 3 during an nth read cycle, writing 405 data to a second bank 5 during a nth write cycle, reading 410 data on the first bank 3 during a (nth+1) read cycle, writing 415 data to the second bank 5 during a (nth+1) write cycle, refreshing 420 data on the first bank 3, reading 425 data on the second bank 5 during a (nth+2) read cycle, writing 430 data to the first bank 3 during a (nth+2) write cycle, reading 435 data on the second bank 5 during a (nth+3) read cycle, writing 440 data to the first bank 3 during a (nth+3) write cycle, and refreshing 445 data on the second bank 5.

In the methods illustrated in FIGS. 6 through 9, it is shown, according to the present invention, that the read/write memory operations constantly swap between the read and write cycles, and the read/write memory operations also constantly swap between the first and second bank 3,5, respectively. Moreover, the read/write memory operations occur in a frequency of 2n times within the same bank.

Figure 10:
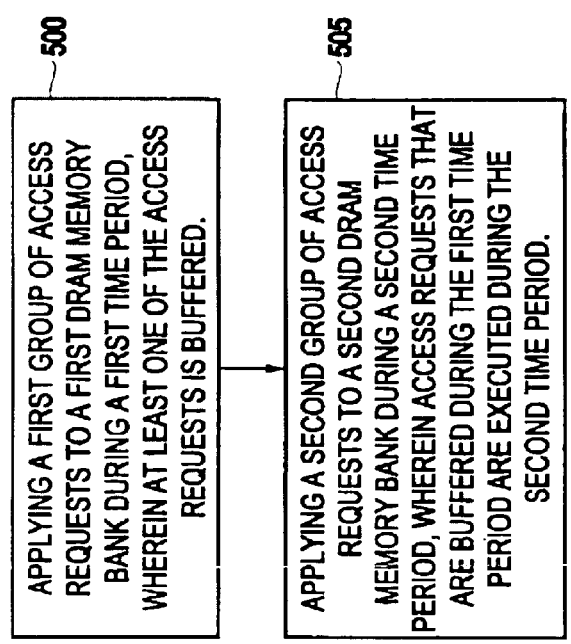
FIG. 10 is a flow diagram illustrating a preferred method of the invention.

Additionally, according to the present invention, a method of accessing banks of dynamic random access memory (DRAM) memory is provided and shown in FIG. 10, wherein the method comprises applying 500 a first group of access requests to a first DRAM memory bank 3 during a first time period, wherein at least one of the access requests is buffered; and applying 505 a second group of access requests to a second DRAM memory bank 5 during a second time period, wherein access requests that are buffered during the first time period are executed during the second time period. The first and second group of access requests comprise read/write memory operations constantly swapping between read and write cycles, wherein the read/write memory operations occur in a frequency of 2n times within each of the first DRAM memory bank 3 and the second DRAM memory bank 5, respectively.

Figure 11:
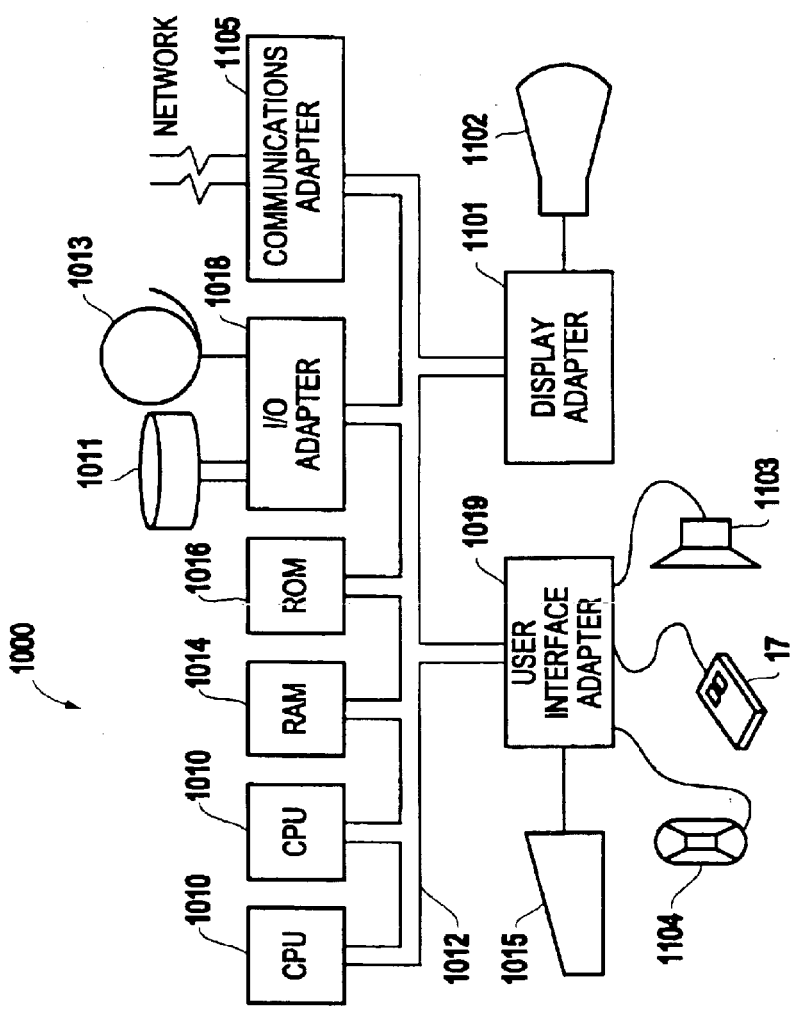
FIG. 11 is a system diagram according to the present invention.

A representative hardware environment for practicing the present invention is depicted in FIG. 11 which illustrates a typical hardware configuration of an information handling/computer system 1000 in accordance with the present invention, having at least one processor or central processing unit (CPU) 1010. The CPUs 1010 are interconnected via system bus 1012 to random access memory (RAM) 1014, read-only memory (ROM) 1016, an input/output (I/O) adapter 1018 for connecting peripheral devices, such as disk units 1011 and tape drives 1013, to bus 1012, user interface adapter 1019 for connecting keyboard 1015, mouse 1017, speaker 1103, microphone 1104, and/or other user interface devices such as a touch screen device (not shown) to bus 1012, communication adapter 1105 for connecting the information handling system to a data processing network, and display adapter 1101 for connecting bus 1012 to display device 1102. A program storage device readable by the disk or tape units is used to load the instructions, which operate the invention, which is loaded onto the computer system 1000.

There are several benefits of the present invention. For example, the present invention provides a novel DRAM-based separate I/O memory solution for communication applications. Also, the present invention provides a novel DRAM-based solution to the standard QDR communications-SRAM solution. Additionally, the present invention provides data rate and cycle times comparable to conventional QDR SRAMs. Furthermore, the present invention achieves at least four times the density and price/bit of conventional QDR SRAM implementations. Another benefit of the present invention is that it provides a novel banking system whereby back-to-back operations are performed on a given bank.

While the invention has been described in terms of preferred embodiments, those skilled in the art will recognize that the invention can be practiced with modification within the spirit and scope of the appended claims.

What is claimed is:

1. A method of performing back-to-back read and write memory operations to a same DRAM bank, said method comprising:
   articulating between reading data on a first bank during successive first bank read cycles and writing data to a second bank during successive second bank write cycles;
   cycling between reading data on said second bank during successive second bank read cycles and writing data to said first bank during successive first bank write cycles; and
   performing a refresh cycle on said first and second bank, wherein said first bank write cycles lag said first bank read cycles, and
   wherein said second bank write cycles lag said second bank read cycles.

2. The method of claim 1, wherein said step of articulating comprises:
   reading data on said first bank during said first bank read cycle;
   writing data to said second bank during said second bank write cycle;
   reading additional data on said first bank during said first bank read cycle; and
   writing additional data to said second bank during said second bank write cycle.

3. The method of claim 1, wherein said step of cycling comprises:
   reading data on said second bank during said second bank read cycle;
   writing data to said first bank during said first bank write cycle;
   reading additional data on said second bank during said second bank read cycle; and
   writing additional data to said first bank during said first bank write cycle.

4. The method of claim 1, wherein said refresh cycle is performed on said first bank after said step of writing additional data to said second bank.

5. The method of claim 1, wherein said refresh cycle is performed on said second bank after said step of writing additional data to said first bank.

6. The method of claim 1, wherein said read and write memory operations constantly swap between said read and write cycles.

7. The method of claim 1, wherein said read and write memory operations constantly swap between said first and second bank.

8. The method of claim 1, wherein said read and write memory operations occur in a frequency of 2n times within the same bank.

9. The method of claim 1, wherein said lag comprises at least two write cycles.

10. A method of performing back-to-back read and write memory operations to a same DRAM bank, said method comprising:
    reading data on a first bank during an nth read cycle;
    writing data to a second bank during a nth write cycle;
    reading data on said first bank during a (nth+1) read cycle;
    writing data to said second bank during a (nth+1) write cycle;
    refreshing data on said first bank;
    reading data on said second bank during a (nth+2) read cycle;
    writing data to said first bank during a (nth+2) write cycle;
    reading data on said second bank during a (nth+3) read cycle;
    writing data to said first bank during a (nth+3) write cycle; and
    refreshing data on said second bank.

11. The method of claim 10, wherein said read and write memory operations occur in a frequency of 2n times within the same bank.

12. A method of accessing banks of dynamic random access memory (DRAM) memory, said method comprising:
    applying a first group of access requests to a first DRAM memory bank during a first time period, wherein at least one of said access requests is buffered; and
    applying a second group of access requests to a second DRAM memory bank during a second time period,
    wherein, access requests that are buffered during said first time period are executed during said second time period.

13. The method of claim 12, wherein said first group of access requests comprises read and write memory operations constantly swapping between read and write cycles.

14. The method of claim 13, wherein said read and write memory operations occur in a frequency of 2n times within each of said first DRAM memory bank.

15. The method of claim 12, wherein said second group of access requests comprises read and write memory operations constantly swapping between read and write cycles.

16. The method of claim 15, wherein said read and write memory operations occur in a frequency of 2n times within each of said second DRAM memory bank.

17. A multi-bank memory circuit operable to allow back-to-back read and write memory operations to be performed on a same DRAM bank, said circuit comprising:
    a plurality of independently addressable DRAM memory banks;
    a refresh counter connected to said DRAM memory banks, said refresh counter operable to send an address to each said DRAM memory banks;
    a read register connected to said DRAM memory banks, said read register operable to send a read address to each said DRAM memory banks;
    a write register connected to said DRAM memory banks, said write register operable to send a write address to each said DRAM memory banks;
    an address comparator connected to said read register and said write register, said address comparator operable to compare said read and write addresses; and
    a plurality of buffers connected to said DRAM memory banks, wherein said buffers artificially reduces an apparent cycle time of said DRAM memory banks.

18. The circuit of claim 17, further comprising a partition array in each said DRAM memory banks.

19. The circuit of claim 18, wherein said address comparator monitors said write registers to determine if said write address has been stored in said partition array.

20. The circuit of claim 17, wherein said refresh counter is operable to track all addresses to be refreshed.

21. The circuit of claim 17, wherein said read and write memory operations constantly swap between a read and write cycle.

22. The circuit of claim 17, wherein said plurality of DRAM memory banks comprises a first and second DRAM memory bank.

23. The circuit of claim 22, wherein said first DRAM memory bank is adapted to receive a first group of access requests during a first time period, wherein said second DRAM memory bank is adapted to receive a second group of access requests during a second time period, wherein at least one of said first access requests is buffered, and wherein said access requests that are buffered during said first time period are executed during said second time period.

24. The circuit of claim 22, wherein said read and write memory operations constantly swap between said first and second DRAM memory bank.

25. The circuit of claim 17, wherein said read and write memory operations occur in a frequency of 2n times within the same bank.

26. The circuit of claim 17, further comprising an input clock operatively connected to said read and write registers, said input clock operable to capture data from said read and write registers.

27. A program storage device readable by machine, tangibly embodying a program of instructions executable by said machine to perform a method of performing back-to-back read/write memory operations to a same DRAM bank, said method comprising:

articulating between reading data on a first bank during successive first bank read cycles and writing data to a second bank during successive second bank write cycles;

cycling between reading data on said second bank during successive second bank read cycles and writing data to said first bank during successive first bank write cycles; and performing a refresh cycle on said first and second bank, wherein said first bank write cycles lag said first bank read cycles, and wherein said second bank write cycles lag said second bank read cycles.

28. The program storage device of claim 27, wherein said step of articulating comprises:

reading data on said first bank during said first bank read cycle;

writing,data to said second bank during said second bank write cycle;

reading additional data on said first bank during said first bank read cycle; and writing additional data to said second bank during said second bank write cycle.

29. The program storage device of claim 27, wherein said step of cycling comprises:

reading data on said second bank during said second bank read cycle;

writing data to said first bank during said first bank write cycle;

reading additional data on said second bank during said second bank read cycle; and writing additional data to said first bank during said first bank write cycle.

30. The program storage device of claim 27, wherein said refresh cycle is performed on said first bank after said step of writing additional data to said second bank.

31. The program storage device of claim 27, wherein said refresh cycle is performed on said second bank after said step of writing additional data to said first bank.

32. The program storage device of claim 27, wherein said read and write memory operations constantly swap between said read and write cycles.

33. The program storage device of claim 27, wherein said read and write memory operations constantly swap between said first and second bank.

34. The program storage device of claim 27, wherein said read and write memory operations occur in a frequency of 2n times within the same bank.

35. The program storage device of claim 27, wherein said lag comprises at least two write cycles.

* * * * *